(12) United States Patent  
Matsubara

(10) Patent No.: US 7,373,835 B2  
(45) Date of Patent: May 20, 2008

(54) SEMICONDUCTOR SENSOR

(75) Inventor: Naoteru Matsubara, Gifu-ken (JP)

(73) Assignee: Sanyo Electric Industries, Ltd., Osaka (JP)

( * ) Notice: Subject to any disclaimer, the term of this patent is extended or adjusted under 35 U.S.C. 154(b) by 54 days.

(21) Appl. No.: 11/300,445

(22) Filed: Dec. 15, 2005

(65) Prior Publication Data

US 2006/0169049 A1 Aug. 3, 2006

(30) Foreign Application Priority Data

Jan. 31, 2005 (JP) ............................. 2005-022739
Feb. 25, 2005 (JP) ............................. 2005-051871

(51) Int. Cl.
*G01L 7/00* (2006.01)
(52) U.S. Cl. .......................................... 73/756; 73/754
(58) Field of Classification Search ................ 73/754, 73/767, 756
See application file for complete search history.

(56) References Cited

U.S. PATENT DOCUMENTS

| 4,070,741 | A | * | 1/1978 | Djuric ........................ 29/25.42 |
| 4,386,453 | A | * | 6/1983 | Giachino et al. ............ 29/25.41 |
| 4,426,673 | A | * | 1/1984 | Bell et al. .................. 361/283.4 |
| 6,122,974 | A | * | 9/2000 | Sato et al. ...................... 73/754 |
| 6,388,887 | B1 | * | 5/2002 | Matsumoto et al. ......... 361/760 |
| 6,591,689 | B2 | * | 7/2003 | Nidan et al. ................... 73/754 |
| 6,653,846 | B2 | * | 11/2003 | James ......................... 324/555 |

FOREIGN PATENT DOCUMENTS

| JP | 60-500841 | 5/1985 |
| JP | 2000-124217 | 4/2000 |
| JP | 2004-537182 | 12/2004 |
| WO | WO 84/03410 | 8/1984 |
| WO | WO 02/45463 A2 | 6/2002 |

* cited by examiner

*Primary Examiner*—Andre J. Allen
(74) *Attorney, Agent, or Firm*—McDermott Will & Emery LLP

(57) ABSTRACT

A semiconductor sensor for improving manufacturing productivity. Opposing electrodes, or a diaphragm electrode and a fixed electrode, form an electrostatic capacity sensing semiconductor microphone on a microphone chip. A through electrode is formed on the microphone chip by a conductor extending between the upper and lower surfaces of the semiconductor substrate. The through electrode directly and electrically connects a MEMS configuration formed by the diaphragm electrode to the wiring of a printed wiring board without using wire bonding.

17 Claims, 13 Drawing Sheets

SEMICONDUCTOR SENSOR

CROSS-REFERENCE TO RELATED APPLICATIONS

This application is based upon and claims the benefit of priority from prior Japanese Patent Application Nos. 2005-022739, filed on Jan. 31, 2005, and 2005-051871, filed on Feb. 25, 2005, the entire contents of which are incorporated herein by reference.

BACKGROUND OF THE INVENTION

The present invention relates to a semiconductor sensor incorporating a diaphragm formed on a semiconductor substrate, and more particularly, to an improvement of an electrical connection configuration for increasing the manufacturing productivity for the semiconductor sensor.

Recently, progress in Micro Electro Mechanical System (MEMS) technology for forming a mechanical component (movable component) and an electrical component on a semiconductor substrate has resulted in development of a microscopic semiconductor sensor incorporating a diaphragm formed on a semiconductor substrate. A diaphragm type semiconductor sensor has been applied to acoustic sensors, pressure sensors, acceleration sensors, and etc.

An example of diaphragm type acoustic sensor is an electrostatic capacity sensing semiconductor microphone described in Japanese Laid-Open Patent Publication No. 60-500841. The electrostatic capacity sensing semiconductor microphone includes a diaphragm electrode, which vibrates in accordance with the sound pressure, and a fixed electrode, which is fixed to the semiconductor substrate. The diaphragm electrode is arranged facing towards the fixed electrode. Vibrations of the diaphragm electrode change the distance between the two electrodes. The change in the distance between the electrodes changes the electrostatic capacity of a capacitor formed by the two electrodes. The electrostatic capacity sensing semiconductor microphone outputs a detected signal in accordance with the voltage change resulting from the change in electrostatic capacity.

Japanese National Phase Patent Publication No. 2004-537182 describes a package for protecting a semiconductor substrate (sensor chip) on which a diaphragm type semiconductor sensor is formed. In the package, the sensor chip is adhered and coupled to a printed wiring board with an IC chip on which a control integrated circuit for the sensor is formed. The surface of the printed wiring board is covered with a cover. The diaphragm is exposed from the sensor chip. Thus, the MEMS configuration of the diaphragm and the like is normally formed in the surface of the semiconductor substrate located opposite to the side to which the printed wiring board is adhered. Thus, in the prior art, the IC chip or the wiring of the printed wiring board is wire bonded to the sensor chip in the package.

To perform wire bonding, a bonding electrode pad must be formed on both surfaces of the printed wiring board and the sensor chip. The electrode pad increases the area for the printed wiring board and the sensor chip and enlarges the package module of the semiconductor sensor.

In wire bonding, a manufacturing defect may be caused due to ultrasonic vibrations generated when connecting wires to the bonding electrode pad. A normal semiconductor device that does not have a MEMS configuration has a rigid bulk structure in which there is substantially no gaps, fine linear portions, and thin portions. Thus, such a semiconductor device has a relatively high resistance with respect to ultrasonic vibration. Comparatively, a semiconductor sensor incorporating movable components such as a diaphragm often includes gaps, fine liner portions, and thin portions. Thus, there is a tendency for manufacturing defects to be caused by ultrasonic vibrations. Particularly, in a microphone for detecting sound, the rigidity of the diaphragm cannot be significantly increased since sensitivity must be increased. Thus, a microphone is more likely to be affected by ultrasonic vibrations than other types of diaphragm semiconductor sensors, such as a pressure sensor, an acceleration sensor, and the like.

Wire bonding increases the manufacturing cost. Generally, gold or aluminum is used for the bonding electrode pad. In a semiconductor device that does not include a MEMS configuration, aluminum, which is relatively inexpensive, is often used as the material for the bonding pad. However, in a semiconductor sensor including a MEMS configuration, a sacrifice layer must be removed with hydrofluoric acid to form movable components. Thus, aluminum must have high solubility with respect to hydrofluoric acid. As a result, gold, which is more expensive, must be used. This increases the manufacturing cost.

SUMMARY OF THE INVENTION

It is an object of the present invention to provide a semiconductor sensor that increases manufacturing productivity.

One aspect of the present invention is a semiconductor sensor provided with a semiconductor substrate including a first surface and a second surface opposite the first surface. A diaphragm is arranged in the first surface of the semiconductor substrate. A through electrode extends through the semiconductor substrate.

Another aspect of the present invention is a semiconductor sensor package module including a printed wiring board. A cover, attached to the printed wiring board, cooperates with the printed wiring board to define an internal space. A semiconductor sensor is arranged in the internal space and adhered and coupled to the printed wiring board. The semiconductor sensor includes a semiconductor substrate including a first surface, a second surface opposite the first surface, a first hole for connecting the first surface and the second surface at a first position, and a second hole for connecting the first surface and the second surface at a second position. A fixed electrode is arranged in the first surface of the semiconductor substrate at the first position. A displaceable diaphragm electrode is arranged in the first surface of the semiconductor substrate at the first position facing the fixed electrode with an air gap defined between the diaphragm electrode and the fixed electrode. A through electrode is arranged in the second hole for connecting the first surface and the second surface of the semiconductor substrate.

A further aspect of the present invention is a method for manufacturing a semiconductor sensor. The semiconductor sensor includes a semiconductor substrate having a first surface and a second surface opposite the first surface. A diaphragm is arranged in the first surface of the semiconductor substrate. A through electrode extends through the semiconductor substrate for connecting the first surface and the second surface. The method includes etching the semiconductor substrate for simultaneously forming a first hole, extending between the first surface and the second surface at a first position in which the diaphragm of the semiconductor substrate is formed, and a second hole, extending between the first surface and the second surface at a second position in which the through electrode of the semiconductor substrate is formed. The method further includes forming the through electrode by embedding the second hole with a conductor.

Another aspect of the present invention is a method for manufacturing a semiconductor sensor. The semiconductor sensor includes a semiconductor substrate having a first surface and a second surface opposite the first surface. A diaphragm is arranged in the first surface of the semiconductor substrate. A through electrode extends through the semiconductor substrate so as to connect the first surface and the second surface. The method includes etching the semiconductor substrate for simultaneously forming a first hole having an opening in the second surface and a bottom in the first surface at a first position in which the diaphragm of the semiconductor substrate is formed, and a second hole having an opening in the first surface and a bottom in the second surface at a second position in which the through electrode of the semiconductor substrate is formed. The method further includes forming the through electrode by filling a conductor in the second hole through the opening of the second hole from the first surface of the semiconductor substrate.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
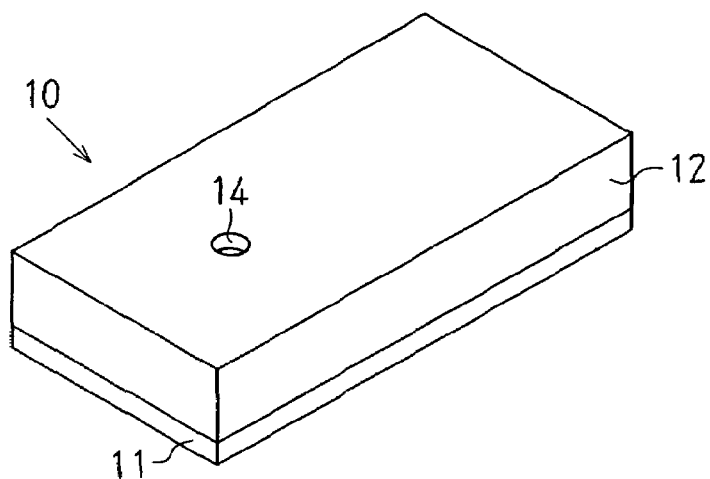
FIG. 1 is a perspective view of a package module for a semiconductor sensor according to a first embodiment of the present invention.
Figure 2:
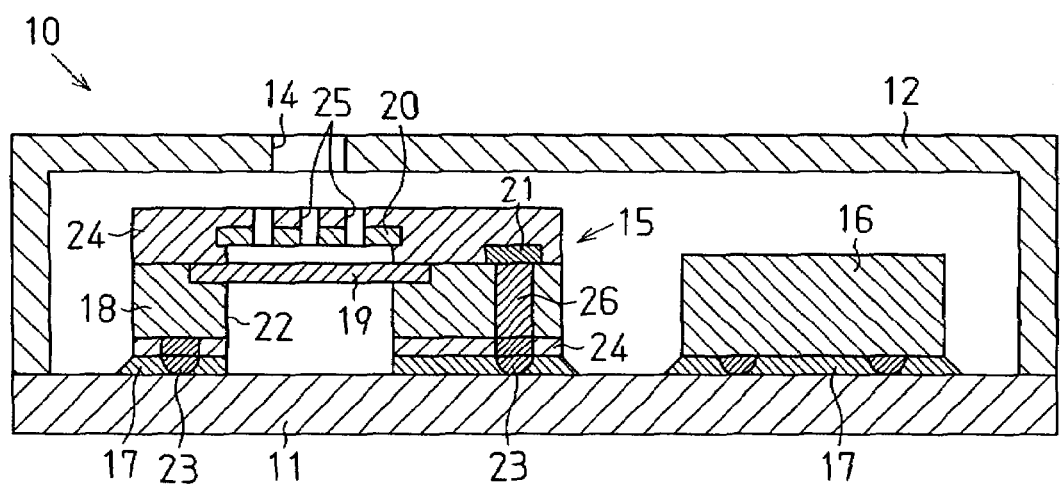
FIG. 2 is a cross-sectional view of the package module of FIG. 1.

A semiconductor sensor according to a first embodiment of the present invention will now be described in detail with reference to FIGS. 1 to 4. The semiconductor sensor of the first embodiment is applied to an electrostatic capacity sensing semiconductor microphone. As shown in FIGS. 1 and 2, the semiconductor microphone is a package module 10 in which a microphone chip 15 and an IC chip 16 are packaged. The microphone chip 15 functions as a semiconductor sensor.

A printed wiring board 11 and a cover 12, which is attached to the printed wiring board 11, are exposed from the outer surface of the package module 10. A sound hole 14 is formed in one surface of the cover 12.

As shown in FIG. 2, the printed wiring board 11 and the cover 12 define an internal space in the package module 10. The microphone chip 15 and the IC chip 16, each including a semiconductor substrate, are accommodated in the internal space. The chips 15, 16 are adhered and coupled to the upper surface of the printed wiring board 11 with an adhesive 17. The microphone chip 15 has an MEMS configuration functioning as an electrostatic capacity sensing acoustic sensor portion. The microphone chip 15 is electrically connected to the IC chip 16 by a wire formed on the printed wiring board 11. The IC chip 16 includes an integrated circuit for controlling the electrostatic capacity sensing acoustic sensor portion.

Figure 3A:
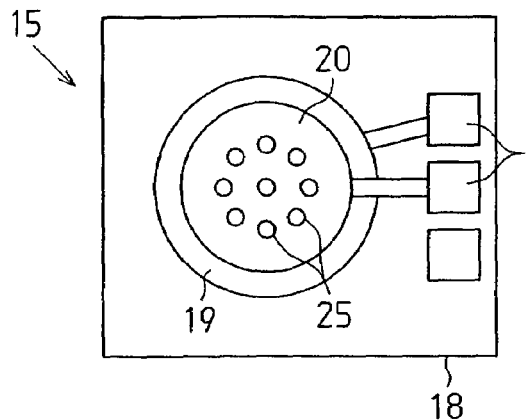
FIGS. 3A, 3B, and 3C are respectively a top view, bottom view, and cross-sectional view of a microphone chip included in the package module of FIG. 1.

The microphone chip 15 includes a semiconductor substrate 18, and a protection film 24 for covering the upper surface and the lower surface of the semiconductor substrate 18. In one example, the protection film 24 is made of silicon dioxide ($SiO_2$). As shown in FIG. 3A, the semiconductor substrate 18 includes an upper surface having a MEMS configuration. The MEMS configuration includes a diaphragm electrode (movable or deformable electrode) 19 and a fixed electrode (immovable or undeformable electrode) 20. The diaphragm electrode 19 and the fixed electrode 20 function as opposing electrodes of the capacitor. The diaphragm electrode 19 and the fixed electrode 20 are wire-connected to aluminum electrode pads 21 formed on the upper surface of the semiconductor substrate 18.

Figure 3B:
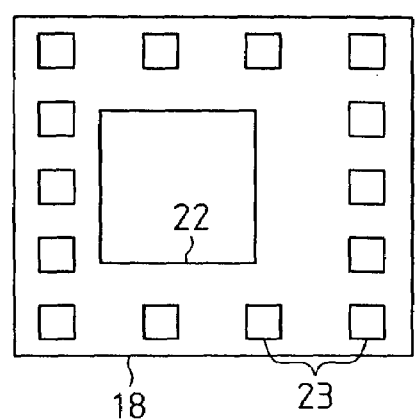
Figure 3C:
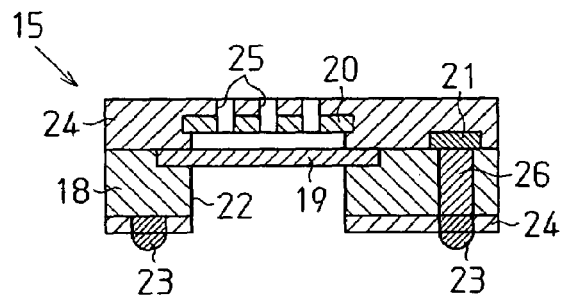

FIG. 3B is a bottom view of the semiconductor substrate 18. FIG. 3C is a cross-sectional view of the microphone chip 15. The semiconductor substrate 18 includes a first through hole 22 located at a position at which the diaphragm electrode 19 is formed. A plurality of spaced solder balls 23 are formed along the peripheral portion of the lower surface of the semiconductor substrate 18.

The entire fixed electrode 20 is covered with the protection film 24 so as to be immovable. A gap (air gap) is formed between the fixed electrode 20 and the diaphragm electrode 19. The peripheral portion of the diaphragm electrode 19 is fixed to the semiconductor substrate 18. The central portion of the diaphragm electrode 19 is displaceable with respect to the fixed electrode 20. The central portion of the diaphragm electrode 19 is completely separated from the surrounding structure. A plurality of holes 25 for releasing air from the air gap are formed in the fixed electrode 20.

The electrode pads 21, which are connected to the diaphragm 19 and the fixed electrode 20, are electrically connected to a plurality of through electrodes 26, respectively. Each through electrode 26 connects the upper surface and the lower surface of the semiconductor substrate 18 and includes an electric conductor (e.g., copper) filled into a second through hole (electrode hole) that pierces the semiconductor substrate 18. Each through electrode 26 includes an end exposed from the lower surface of the semiconductor substrate 18.

The solder balls 23 may be arranged at positions corresponding to the through electrodes 26. Alternatively, some of the solder balls 23 may be arranged at positions corresponding to the through electrodes 26, while other solder balls 23 are arranged at positions separated from the through electrodes 26.

Figure 4:
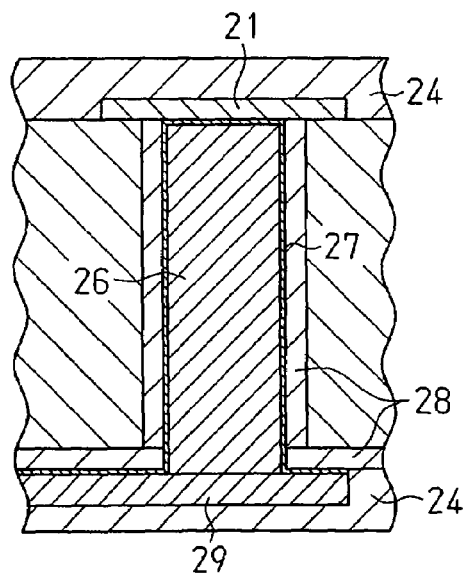
FIG. 4 is an enlarged cross-sectional view of FIG. 3C.

As shown in FIG. 4, a barrier layer 27, which is formed from titanium nitride (Tin), and a protection film 28, which is formed from silicon dioxide, are applied to the surface of each electrode 26. The barrier layer 27 and the protection film 28 isolate the through electrode 26 and the semiconductor substrate 18. When necessary, a wiring layer 29, which is made of an electric conductor such as copper, is formed on the lower surface of the semiconductor substrate 18. The wiring layer 29 connects the through electrode 26 and the solder balls 23 that are located at positions separated from the through electrode 26. The through electrode 26 is electrically connected to the wiring of the printed wiring board 11 (refer to FIG. 2) by the solder balls 23.

The semiconductor sensor of the first embodiment has the advantages described below.

The through electrode 26 directly connects the MEMS configuration formed on the upper surface of the semiconductor substrate 18 to the wiring of the printed wiring board 11. Thus, there is no need for wire bonding to connect the MEMS configuration and the printed wiring board 11. This obtains a semiconductor sensor that increases manufacturing productivity without causing problems, such as enlargement of the packaging area, manufacturing defects resulting from ultrasonic vibrations, and increase in manufacturing costs.

A semiconductor sensor according to a second embodiment of the present invention will now be described with reference to FIGS. 5 and 6. To avoid redundancy, like or same reference numerals are given to those components that are the same as the corresponding components of the first embodiment. Such components will not be described.

Figure 6:
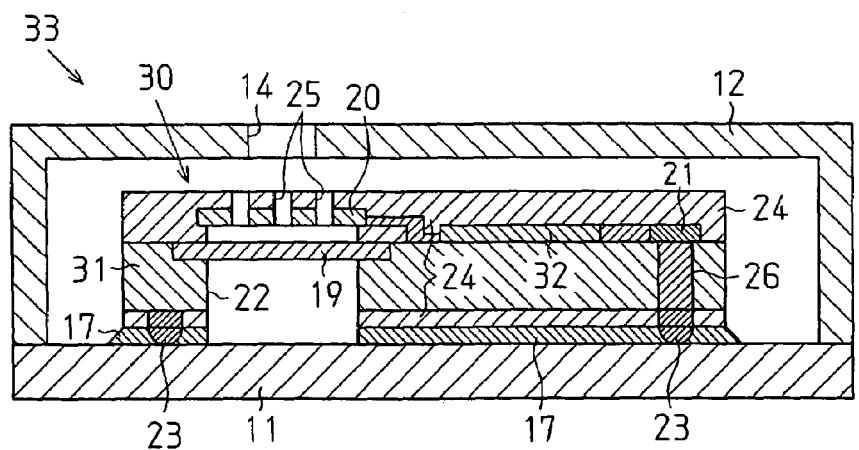
FIG. 6 is a cross-sectional view of a semiconductor sensor package module accommodating the semiconductor sensor of FIG. 5.

As shown in FIG. 6, a package module 33 of the second embodiment includes an integrated chip 30, which integrates both functions of the microphone chip 15 and the IC chip 16 shown in FIG. 2. The integrated chip 30 serves as a sound detection unit, that is, a semiconductor sensor. The integrated chip 30 enables the package module 33 to be miniaturized and reduces the manufacturing cost.

Figure 5A:
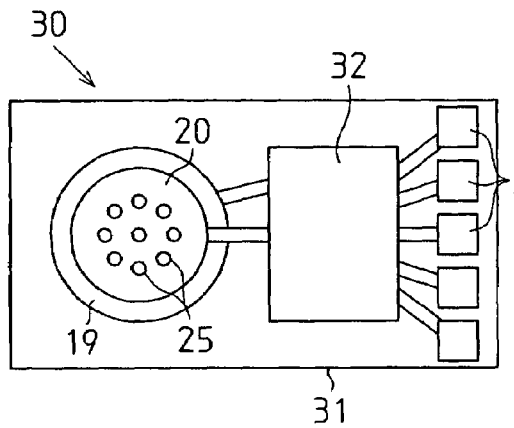
FIGS. 5A, 5B, and 5C are respectively a top view, bottom view, and cross-sectional view of a semiconductor sensor according to a second embodiment of the present invention.
Figure 5B:
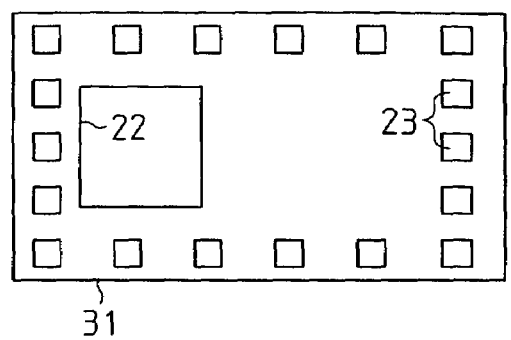

As shown in FIG. 5A, the integrated chip 30 includes a microphone control integrated circuit 32 formed on the upper surface of the semiconductor substrate 31. The integrated circuit 32 is directly wire-connected to the diaphragm electrode 19 and the fixed electrode 20. The integrated circuit 32 is also wire-connected to a plurality of electrode pads 21.

Figure 5C:
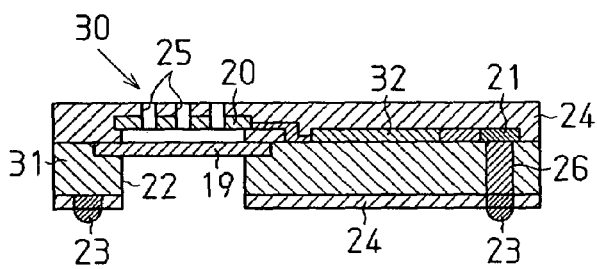

As shown in FIG. 5C, the semiconductor substrate 31 includes through electrodes 26 formed at positions corresponding to the electrode pads 21, which are wire-connected to the integrated circuit 32. Each through electrode 26 extends from the upper surface to the lower surface of the semiconductor substrate 31. Each through electrode 26 is connected to a solder ball 23 located on the lower surface of the semiconductor substrate 31.

As shown in FIG. 6, the lower surface of the integrated chip 30 is adhered and coupled to the printed wiring board 11 with the adhesive 17. The integrated circuit 32 is electrically connected to the wiring of the printed wiring board 11 by the through electrodes 26 and the solder balls 23.

The second embodiment has the same advantages as the first embodiment.

A semiconductor sensor according to a third embodiment of the present invention will now be described with reference to FIG. 7 to FIG. 8.

An integrated chip 40, which functions as a sound detection unit or a semiconductor sensor, includes a diaphragm electrode 19 formed on the upper surface of a semiconductor substrate 41 and a microphone control integrated circuit 42 formed on the lower surface of the semiconductor substrate 41. The through electrodes 26 facilitate the electrical connection between the MEMS configuration (19, 20) and the integrated circuit 42 formed on opposite surfaces of the semiconductor substrate 41.

Figure 7A:
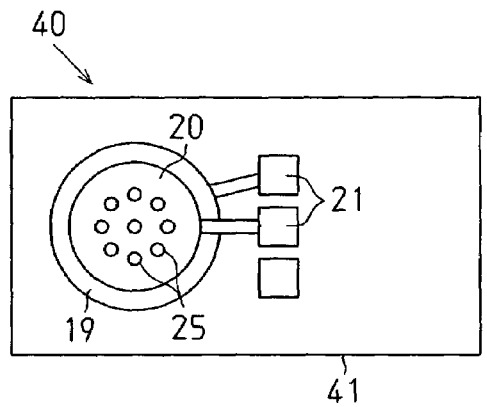
FIGS. 7A, 7B, and 7C are respectively a top view, bottom view, and cross-sectional view of a semiconductor sensor according to a third embodiment of the present invention.
Figure 7B:
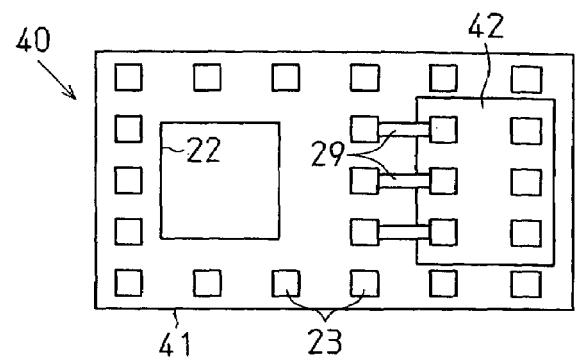
Figure 7C:
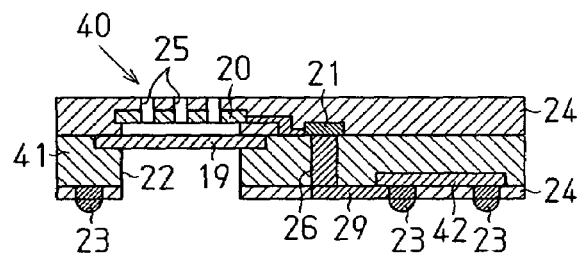

As shown in FIG. 7A, the diaphragm electrode 19, the fixed electrode 20, and the electrode pads 21, which are connected to the diaphragm electrode 19 and the fixed electrode 20, are formed on the upper surface of the semiconductor substrate 41. As shown in FIG. 7B, the integrated circuit 42 is formed on the lower surface of the semiconductor substrate 41. As shown in FIG. 7C, the semiconductor substrate 41 includes through electrodes 26 formed at positions corresponding to the electrode pads 21, which are wire-connected to the integrated circuit 42. Each through electrode 26 extends from the upper surface to the lower surface of the semiconductor substrate 41. Each through electrode 26 is wire-connected to the integrated circuit 42 by a wiring layer 29, which is formed on the lower surface of the semiconductor substrate 41.

Figure 8:
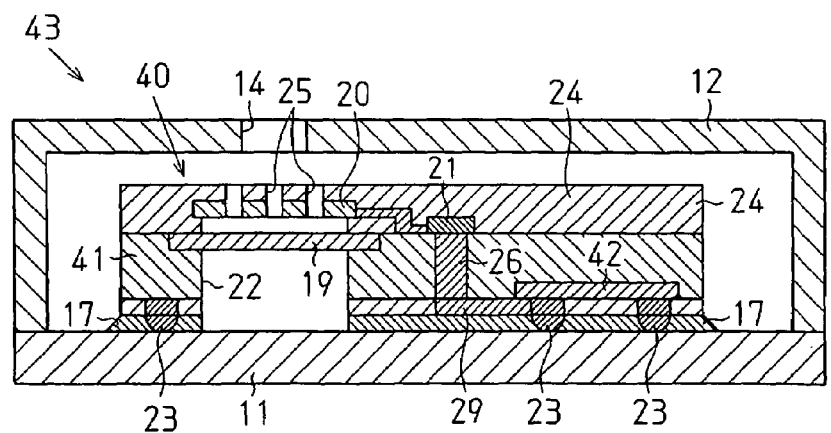
FIG. 8 is a cross-sectional view of a semiconductor sensor package module accommodating the semiconductor sensor of FIG. 7.

As shown in FIG. 8, the lower surface of the integrated chip 40 is adhered and coupled to the printed wiring board 11 with the adhesive 17. The integrated circuit 42 formed on the lower surface of the semiconductor substrate 41 is electrically connected to the wiring of the printed wiring board 11 by the solder balls 23. A cover 12 is attached to the printed wiring board 11 to form a package module 43.

The third embodiment has the same advantages as the first embodiment.

The first to the third embodiments may be modified as described below.

Figure 9:
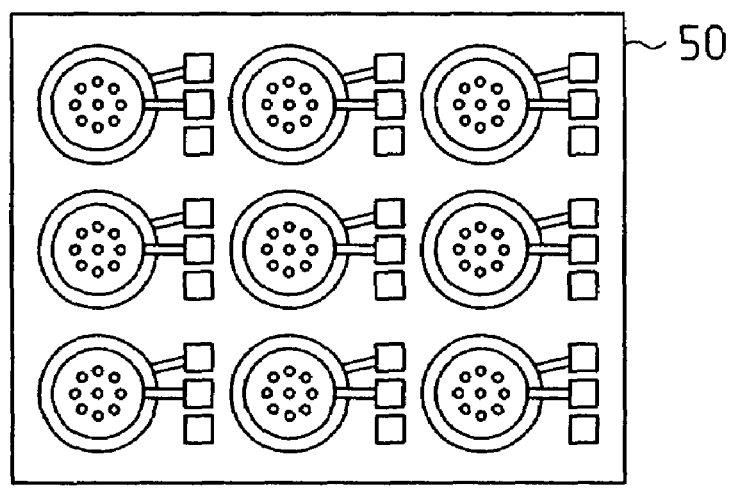
FIG. 9 is a top view of a semiconductor sensor array.

FIG. 9 shows a semiconductor microphone array 50. The layout of a plurality of semiconductor microphones on a single semiconductor substrate give directivity to sound detection and reduces noise. The electrical connection described in the above embodiments may be applied to the semiconductor microphone array 50.

Further, problems that occur due to wire bonding would become prominent when there are many electrically connected electrodes. Such problems would be resolved when using the semiconductor microphone array 50, which does not require wire bonding.

A method of manufacturing a semiconductor sensor chip according to a fourth embodiment of the present invention will now be described with reference to FIGS. 10 to 14.

Figure 10:
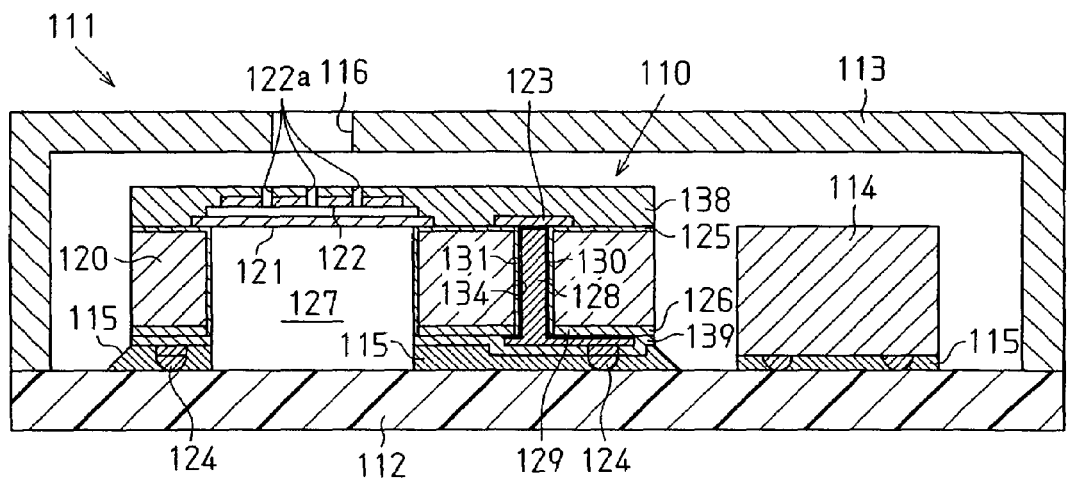
FIG. 10 is a cross-sectional view of a package accommodating a semiconductor sensor chip manufactured through a manufacturing method according to a fourth embodiment of the present invention.

FIG. 10 is a cross-sectional view of a package module 111 that uses the semiconductor sensor of the fourth embodiment. The package module 111 includes a printed wiring board 112 and a cover 113, which is attached to the board 112. The printed wiring board 112 and the cover 113 define an internal space in the package module 111. The semiconductor sensor chip 110 and the IC chip 114 for controlling the semiconductor sensor chip 110 are arranged in the internal space of the package module 111. Further, the semiconductor sensor chip 110 and the IC chip 114 are adhered and coupled to the upper surface of the printed wiring board 112 with an adhesive 115. The semiconductor sensor chip 110 is electrically connected to the IC chip 114 by wires formed on the upper surface of the printed wiring board 112. The cover 113 includes a sound hole 116 located at a position corresponding to the MEMS configuration of the semiconductor sensor chip 110.

Figure 11A:
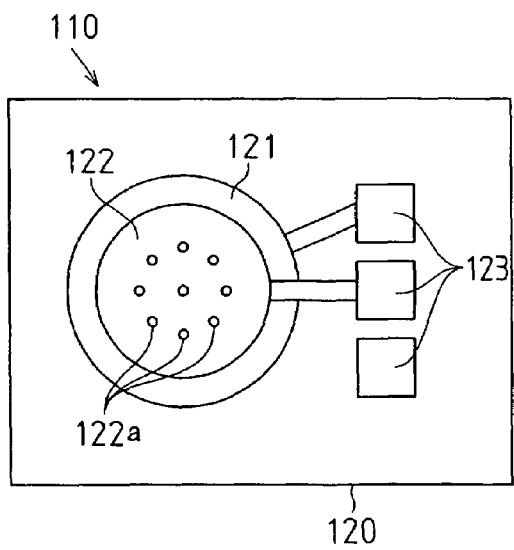
FIGS. 11A and 11B are respectively a top view and bottom view of the semiconductor sensor chip of FIG. 10.
Figure 11B:
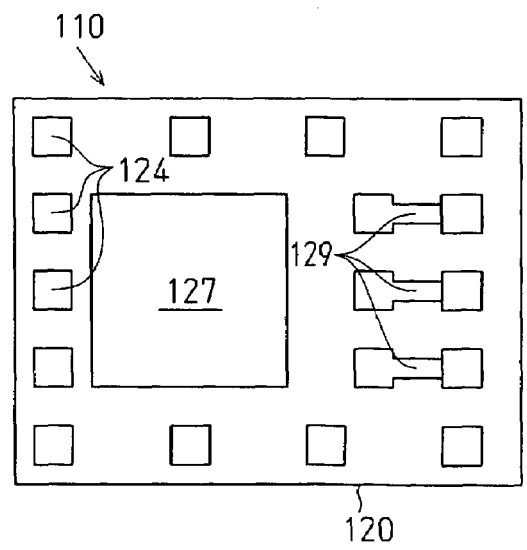

As shown in FIG. 11A, the semiconductor sensor chip 110 includes a semiconductor substrate 120 having an upper surface with a MEMS configuration. The MEMS configuration includes a diaphragm electrode 121 and a fixed electrode 122. Both electrodes function as opposing electrodes of the capacitor. The diaphragm electrode 121 and the fixed electrode 122 are wire-connected to aluminum electrode pads 123 formed on the upper surface of the semiconductor substrate 120. As shown in FIG. 11B, a plurality of solder balls 124 are formed along the peripheral portion of the lower surface of the semiconductor substrate 120. When adhered to the printed wiring board 112, the solder balls 124 contact the upper surface of the printed wiring board 112 (refer to FIG. 10).

Figure 12:
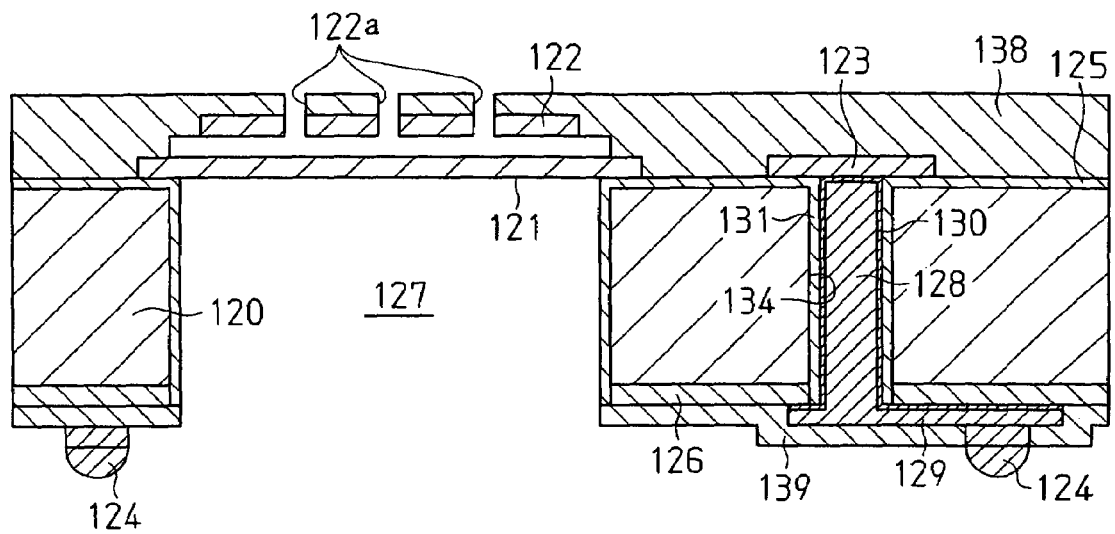
FIG. 12 is a cross-sectional view of the semiconductor sensor chip of FIG. 10.

As shown in FIG. 12, the semiconductor substrate 120 includes a first through hole 127 extending from the upper surface to the lower surface of the semiconductor substrate 120 at a position corresponding to the opposing electrodes (diaphragm electrode 121, fixed electrode 122). Insulative protection films 125, 126, 138, 139, each made of silicon dioxide ($SiO_2$), are applied to the upper surface and lower surface of the semiconductor substrate 120. The upper side of the fixed electrode 122 is fixed by the insulative protection film 125. A gap (air gap) is formed between the fixed electrode 122 and the diaphragm electrode 121. The peripheral portion of the diaphragm electrode 121 is fixed, and the central portion of the diaphragm electrode 121 is separated from the surrounding structure. The central portion of the diaphragm electrode 121 is displaceable with respect to the fixed electrode 122. A plurality of air release holes 122a are formed in the fixed electrode 122. Air is released from the air gap through the air release holes 122a. This smoothly vibrates the diaphragm electrode 121 in accordance with sound pressure.

The semiconductor substrate 120 includes second through holes 134 located at positions corresponding to the electrode pads 123, which are connected to the diaphragm electrode 121 and the fixed electrode 122 of the electrode pads 123. An electric conductor (e.g. copper) is filled in the second through holes 134. This forms through electrodes 128 connecting the upper surface and the lower surface of the semiconductor substrate 120. Wires 129 for electrically connecting the through electrodes 128 to the corresponding solder balls 124 are formed on the lower surface of the semiconductor substrate 120.

Figure 13:
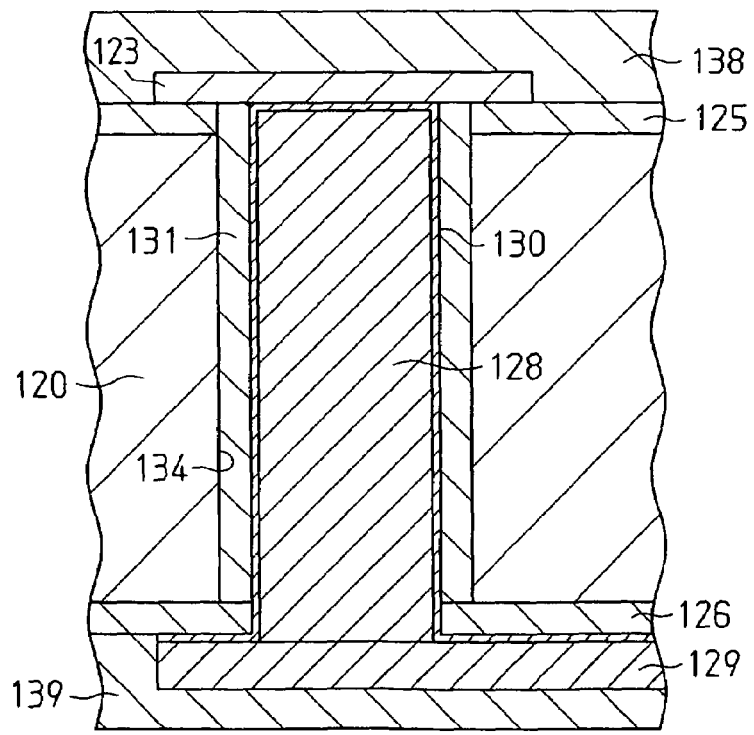
FIG. 13 is an enlarged cross-sectional view of a through electrode in the semiconductor sensor chip of FIG. 10.

As shown in FIG. 13, the side surfaces of each through electrode 128 are covered with a metal barrier layer 130 and an insulative protection film 131. The metal barrier layer 130 is made of titanium (Ti), titanium nitride (Tin), tantalum (Ta), or tantalum nitride (Tan). The insulative protection film 131 is made of silicon dioxide. The metal barrier layer 130 and the insulative protection film 131 isolate the through electrode 128 and the semiconductor substrate 120.

The opposing electrodes (diaphragm electrode 121, fixed electrode 122), which are formed on the upper side of the semiconductor substrate 120, are electrically connected to the solder balls 124, which are formed on the lower surface of the semiconductor substrate 120 by the through electrodes 128. This eliminates the need for wire bonding to electrically connect the opposing electrodes and the wiring of the printed wiring board 112 (refer to FIG. 10). This resolves problems such as enlargement of packaging area, manufacturing defects caused by ultrasonic vibrations, and increase in manufacturing cost. Further, manufacturing productivity for the semiconductor sensor chip 110 is increased.

Simultaneous formation of the first through hole 127 and the second through hole 134 on the semiconductor substrate 120 may result in the following problems. It is difficult to selectively fill the second through hole 134 with an electric conductor while keeping the first through hole 127 hollow. With normal methods, in addition to the second through hole 134, there is a possibility of the first through hole 127 also being filled with the electric conductor. To solve this problem, the first through hole 127 and the through electrode 128 may be separately formed on the semiconductor substrate 120. For example, the second through holes 134 may first be formed through etching and then be filled with the electric conductor. Afterwards, the first through hole 127 may be formed through etching. This would prevent the first through hole 127 from being filled with the electric conductor. However, this would increase the number of etching processes. Thus, this method is not preferable.

In the fourth embodiment, the first through hole 127 and the through electrode 128 are formed in the semiconductor substrate 120 using a semi-additive method, which is described in Japanese Laid-Open Publication No. 2000-124217. The semi-additive method will now be explained. The semi-additive method is a technique for selectively forming a plating layer at necessary locations on the upper surface of the substrate through the following processes (A) to (E). This method is generally used when post-processing a printed wiring board or semiconductor device. In the fourth embodiment, a resist layer, which is used in process (B), covers the portion corresponding to the first through hole 127 in the lower surface of the semiconductor substrate 120 but is open at portions corresponding to the second through hole 134.

(A) Formation of an electrically conductive film (plating underlayer film), which functions as a plating electrode, on the surface of a substrate.

(B) Selective formation of the plating resist layer at locations where plating is unnecessary through patterning by performing lithography and the like.

(C) Plating of the substrate surface by performing immersion into a plating bath and supplying current to an underlayer film. In this state, instead of applying a plating resist layer, plating metal is selectively deposited on the surface of the substrate only at locations exposed from the underlayer film.

(D) Removal of plating resist layer.

(E) Removal (etch back) of underlayer film remaining in the portions where plating is unnecessary by performing etching using the layer of the deposited plating metal (plating layer) as a mask.

The procedures for manufacturing the semiconductor sensor chip 110 of the fourth embodiment including the formation of the through electrodes 128 using the semi-additive method will now be described. The semiconductor sensor chip 110 is one of a plurality of chips that are separated from one another after being simultaneously formed on a silicon wafer. The semiconductor sensor chip 110 is manufactured in the order of the following processes 1 to 12.

Process 1: Formation of MEMS Configuration

A MEMS configuration is formed on the upper surface of a silicon wafer 132 (semiconductor substrate 120). Prior to the formation of the MEMS configuration, the insulative protection films 125 and 126, which are formed from silicon dioxide ($SiO_2$), are applied to the upper and lower surfaces of the silicon wafer 132 by performing an oxidation treatment.

Figure 14A:
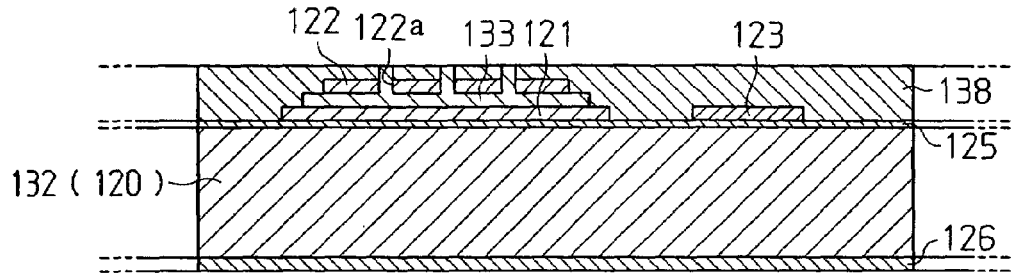
FIGS. 14A to 14K are cross-sectional views showing procedures for manufacturing the semiconductor sensor chip of the fourth embodiment of the present invention.

The MEMS configuration is formed through a typical semiconductor process. That is, various types of necessary layers are sequentially superimposed on the upper surface of the semiconductor substrate 120 by performing patterning through photolithography and the like. Referring to FIG. 14A, this forms the diaphragm electrode 121, the fixed electrode 122, the electrode pads 123, and the wiring, which electrically connects the diaphragm electrode 121, the fixed electrode 122, and the electrode pads 123. In this stage, a sacrifice layer 133 is still left in the air release holes 122a and the air gap between the diaphragm electrode 121 and the fixed electrode 122. An insulative protection film 138 is applied to the upper side of the silicon wafer 132 so as to cover the MEMS configuration.

Process 2: Etching of First through Hole and Second through Holes

Figure 14B:
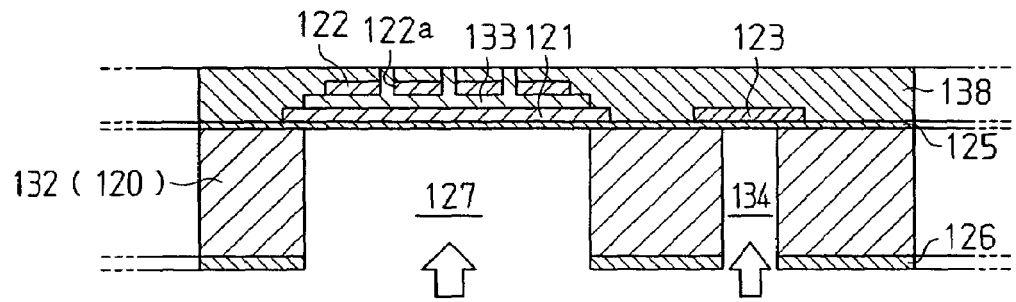

Referring to FIG. 14B, etching is performed from the lower side of the silicon wafer 132 (semiconductor substrate 120), to simultaneously form the first through hole 127 and the second through holes 134 extending from the lower surface to the upper surface of the silicon wafer 132. The first through hole 127 is formed at a position corresponding to the diaphragm electrode 121. The second through holes 134 are formed at positions corresponding to the electrode pads 123.

Process 3: Formation of Insulative Protection Film

Figure 14C:
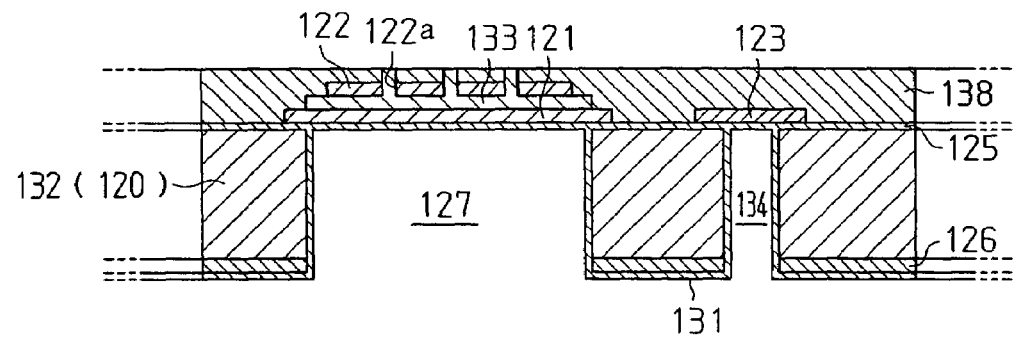

Referring to FIG. 14C, the insulative protection film 131, which is formed from silicon dioxide ($SiO_2$), is applied to the lower surface of the silicon wafer 132. The insulative protection film 131 is also applied to cover the wall surfaces of the first through hole 127 and the second through hole 134.

Process 4: Bottom Etching of Insulative Protection Film

Figure 14D:
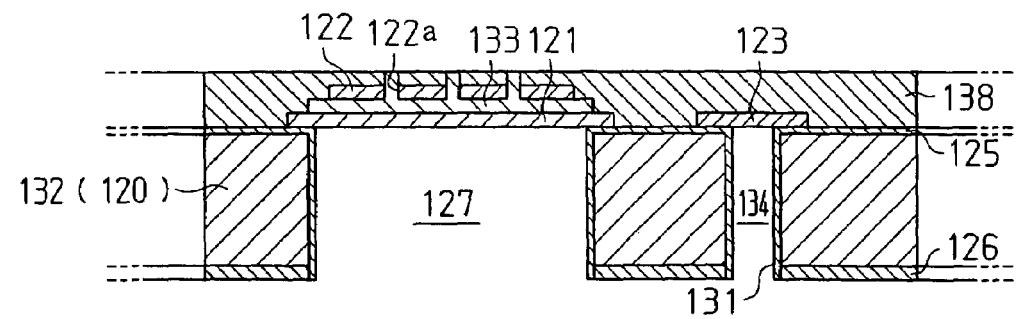
Figure 14E:
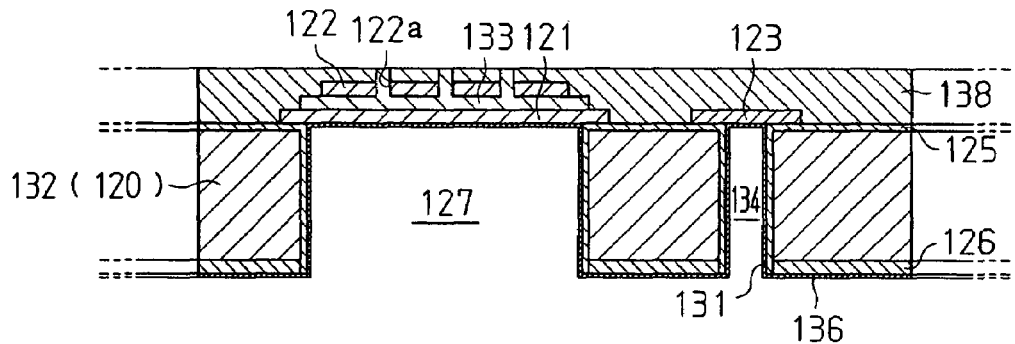

Referring to FIG. 14D, bottom etching is performed on the lower side of the silicon wafer 132 to remove unnecessary portions of the insulative protection film 131. Thus, the insulative protection film 131 remains only on the wall surfaces of the first through hole 127 and the second through hole 134.

The formation of the through electrodes 128 is performed by applying the semi-additive method in the following processes 5 to 8.

Process 5: Underlayer Treatment for Plating

An underlayer treatment for performing copper plating on the lower surface of the silicon wafer 132 is carried out. Specifically, referring to FIG. 14E, a metal barrier layer 130 (refer to FIG. 13) including titanium nitride (Tin), a plating catalyst (Pub) layer, and an underlayer copper plating layer are sequentially superimposed on the entire lower surface of the silicon wafer 132 to form a plating underlayer film 136.

Process 6: Formation of Plating Resist Layer

Figure 14F:
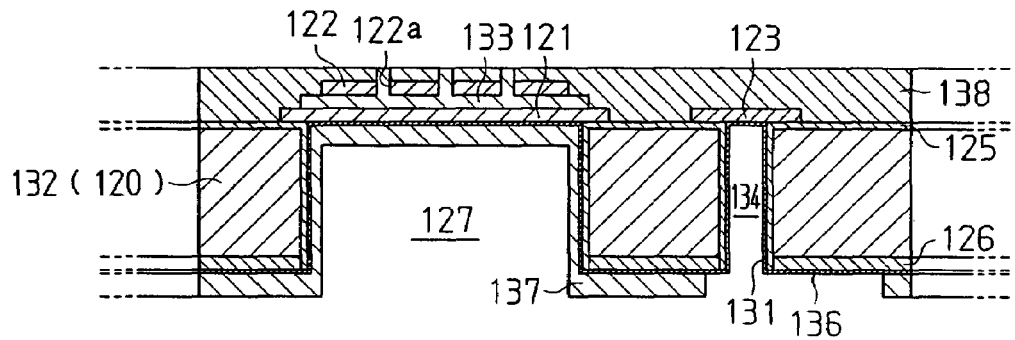

Referring to FIG. 14F, a non-conductive plating resist layer 137 is formed on the lower surface of the silicon wafer 132. The plating resist layer 137 is patterned through photolithography and selectively formed only at portions that do not require plating. Specifically, the plating resist layer 137 is formed on the lower surface of the silicon wafer 132 excluding portions corresponding to the second through hole 134 and portions corresponding to the wires 129 (refer to FIG. 12) for electrically connecting the through electrode 128 and the solder ball 124. The first through hole 127 is covered by the resist layer 137, but the second through hole 134 is not covered by the resist layer 137.

Process 7: Plating Process

Figure 14G:
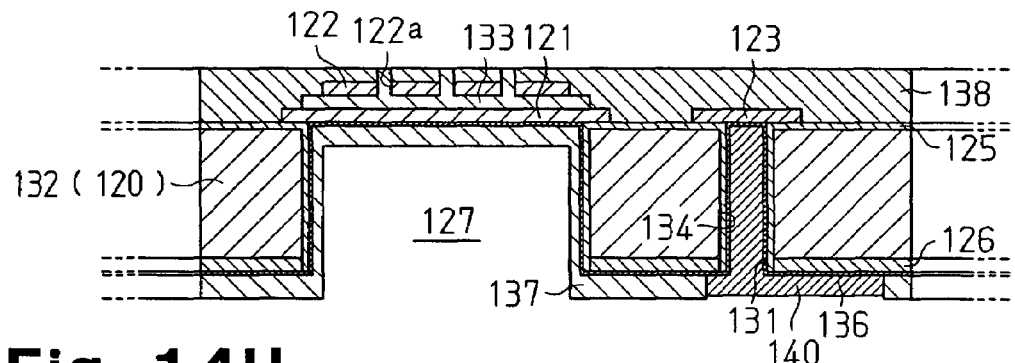

Copper plating is performed on the lower side of the silicon wafer 132. Copper plating is performed by immersing the silicon wafer 132 in a plating bath and supplying current using the plating underlayer film 136 as a plating electrode. Copper is selectively deposited only on exposed portions of the plating underlayer film 136 that are not covered by the plating resist layer 137. Thus, as shown in FIG. 14G, the copper plating layer 140 is selectively formed only in the second through holes 134 and at positions corresponding to the wires 129 (refer to FIG. 12) on the lower surface of the silicon wafer 132.

Process 8: Removal of Plating Resist Layer, Etch Back

The plating resist layer 137 remaining on the lower surface of the silicon wafer 132 is removed. Further, the plating underlayer film 136 is removed (etch back). The removal of the plating resist layer 137 includes immersing the silicon wafer 132 in an exfoliation solution. The removal of the plating underlayer film 136 includes performing wet etching with an iron chloride solution and the like using the copper plating layer 140 as a mask.

Figure 14H:
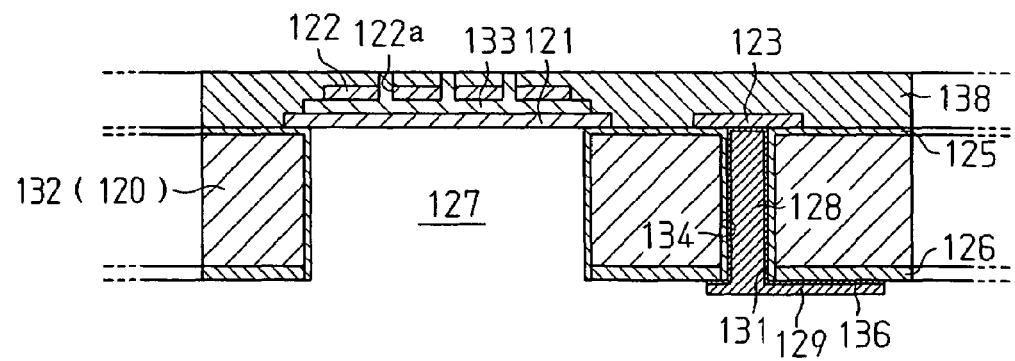

Therefore, the through electrode 128 and the wires 129, which are made of copper, are formed in the silicon wafer 132, as shown in FIG. 14H. Then, processes 9 to 12 are performed in the fourth embodiment.

Process 9: Formation of Insulative Protection Film

Figure 14I:
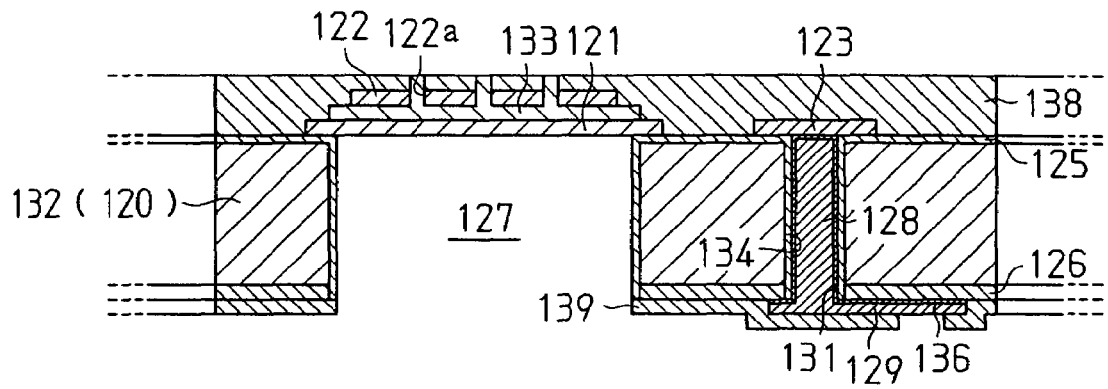

Referring to FIG. 14I, the insulative protection film 139, which is formed from silicon dioxide and which cover at least the through electrodes 128 and the wires 129, is applied to the lower surface of the silicon wafer 132. The portions on which the solder balls 124 are formed are masked before the formation of the insulative protection film 139.

Process 10: Removal of Sacrifice Layer

Figure 14J:
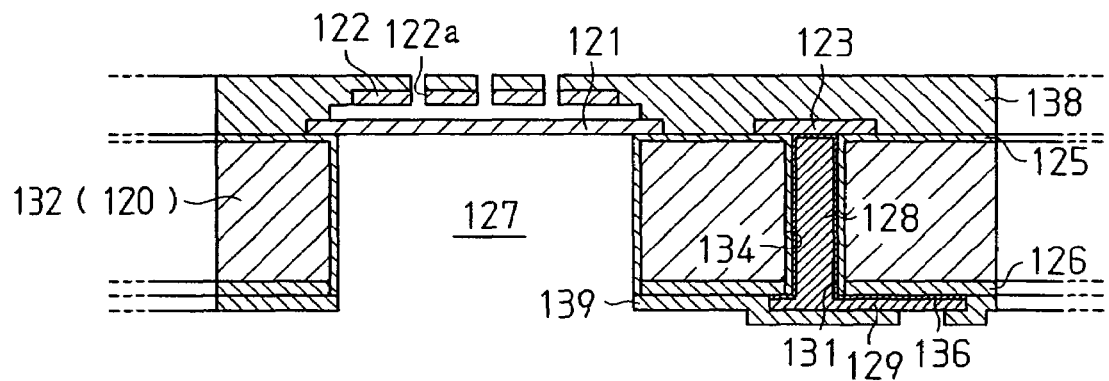

Referring to FIG. 14J, the sacrifice layer 133, which is formed in the air release holes 122a and in the air gap between the diaphragm electrode 121 and the fixed electrode 122, is removed through etching from the upper side of the silicon wafer 132. This forms a space in the MEMS configuration.

Process 11: Formation of Solder Balls

Figure 14K:
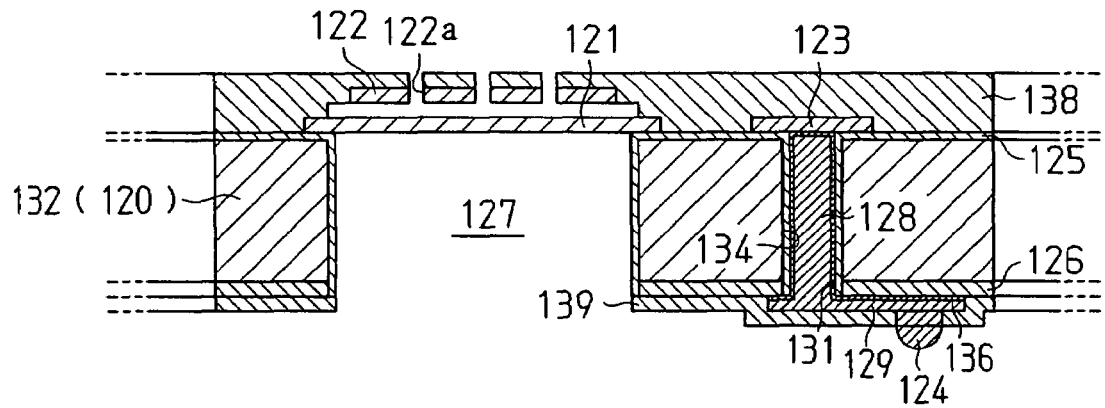

Referring to FIG. 14K, the solder balls 124 are formed on the lower surface of the silicon wafer 132. This completes the formation of each semiconductor sensor chip 110 on the silicon wafer 132.

Process 12: Dicing

Each semiconductor sensor chip 110 is cut apart from the silicon wafer 132.

Then, the semiconductor sensor chip 110 is formed on the printed wiring board 112 (refer to FIG. 10) and accommodated in the package module 111 (refer to FIG. 10). This completes the semiconductor microphone module.

The fourth embodiment includes the advantages described below.

(1) In the semiconductor sensor chip 110, the opposing electrodes (diaphragm electrode 121, fixed electrode 122), which are formed on the upper side of the semiconductor substrate 120, are electrically connected to the solder balls 124, which are formed on the lower surface of the semiconductor substrate 120, by the through electrodes 128. The opposing electrodes are directly and electrically connected to the wiring of the printed wiring board 112. Wire bonding is unnecessary. This resolves problems such as enlargement of packaging area, manufacturing defects caused by ultrasonic vibrations, and increase in manufacturing cost.

(2) The first through hole 127 and the second through hole 134 are simultaneously formed through etching. This reduces the number of etching processes.

(3) The electric conductor (copper) is filled into the second through holes 134 by performing the semi-additive method. Thus, the electric conductor (copper) is selectively filled into the second through holes 134 while keeping the first through hole 127 hollow.

A method for manufacturing a semiconductor sensor chip according to a fifth embodiment of the present invention will now be described focusing on differences from the fourth embodiment.

In the fifth embodiment, the first through hole 127 and the second through holes 134 are respectively formed by simultaneously etching the lower side and the upper side of the semiconductor substrate 120. The first through hole 127 and the second through holes 134 open in different surfaces of the semiconductor substrate 120. By filling the electric conductor from the upper side of the semiconductor 120, the electric conductor is filled only into the second through hole 134 while keeping the first through hole 127 hollow.

Process 1: Formation of MEMS Configuration

Figure 15A:
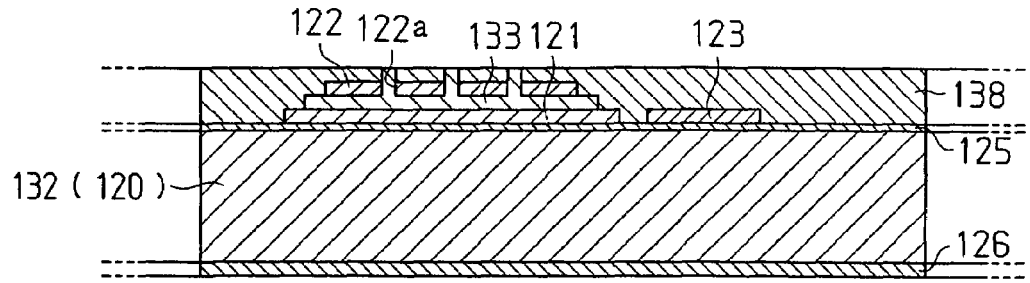
FIGS. 15A to 15L are cross-sectional views showing procedures for manufacturing a semiconductor sensor chip according to a fifth embodiment of the present invention.

In the same manner as in the fourth embodiment, the MEMS configuration is formed on the upper surface of the silicon wafer 132 (semiconductor substrate 120), as shown in FIG. 15A.

Process 2: Etching of First through Hole and Second through Holes

Figure 15B:
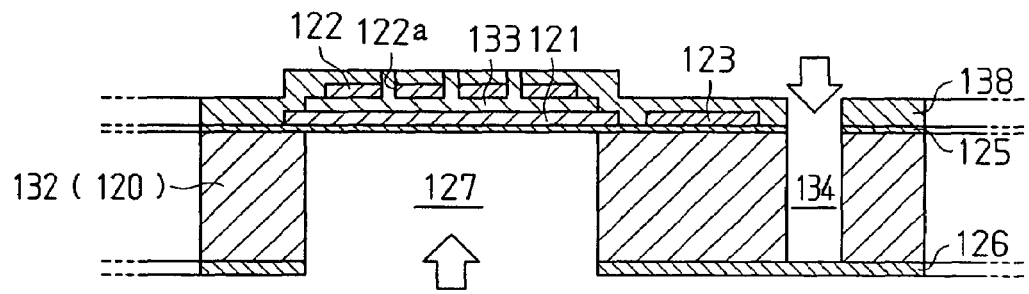

The first through hole 127 and the second through holes 134 are simultaneously formed by performing etching. Before simultaneous etching is performed, masks having openings at portions corresponding to where the second through holes 134 (through electrode 128) and the first through hole 127 are respectively formed on the upper side and the lower side of the silicon wafer 132. Dry etching or wet etching may be performed as the etching. When performing dry etching, a batch process for simultaneously processing a plurality of wafers is carried out. Referring to FIG. 15B, this carries out anisotropic etching from the lower side of the silicon wafer 132 for the first through hole 127 and from the upper side of the silicon wafer 132 for the second through holes 134. When performing wet etching, the silicon wafer 132 is immersed in an alkaline etchant. Further, anisotropic etching is performed from the lower side of the silicon wafer 132 for the first through hole 127 and from the upper side of the silicon wafer 132 for the second through holes 134. Thus, the MEMS configuration opens the first through hole 127 in the lower side of the silicon wafer 132 and closes the first through hole 127 in the upper side of the silicon wafer 132. The second through hole 134 is open in the upper side of the silicon wafer 132 and closed by the insulative protection film 126 of silicon dioxide on the lower side of the silicon wafer 132.

In the fifth embodiment, the second through holes 134 are etched from the upper side of the silicon wafer 132. Thus, the second through holes 134 (through electrodes 128) are formed at positions differing from the electrode pads 123.

Process 3: Formation of Insulative Protection Film

Figure 15C:
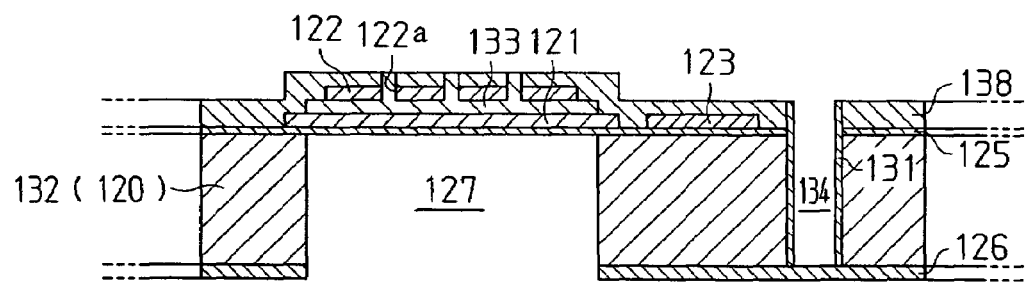

As shown in FIG. 15C, the insulative protection film 131, which is formed from silicon dioxide (SiO$_2$), is applied to the wall surfaces of the second through holes 134. Specifically, after applying the silicon protection film 131, which is formed from silicon dioxide, on the upper side of the silicon wafer 132, bottom etching is performed. The insulative protection film 131 thus remains only on the side walls of the second through holes 134.

Process 4: Opening of Upper Surface of Electrode Pad

Figure 15D:
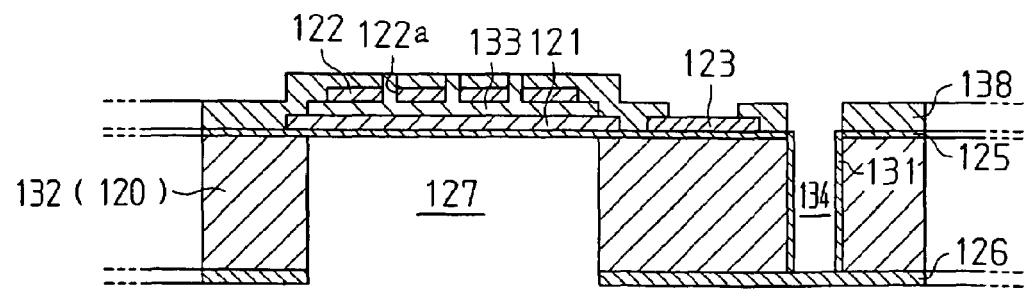

Referring to FIG. 15D, the insulative protection film 138 is removed through etching from the upper surface of the electrode pad 123 to expose the electrode pad 123. This process is performed to form the wiring for electrically connecting the electrode pad 123 and the through electrode 128 (second through hole 134), which are located at different positions as described above.

Process 5: Underlayer Treatment for Plating

Figure 15E:
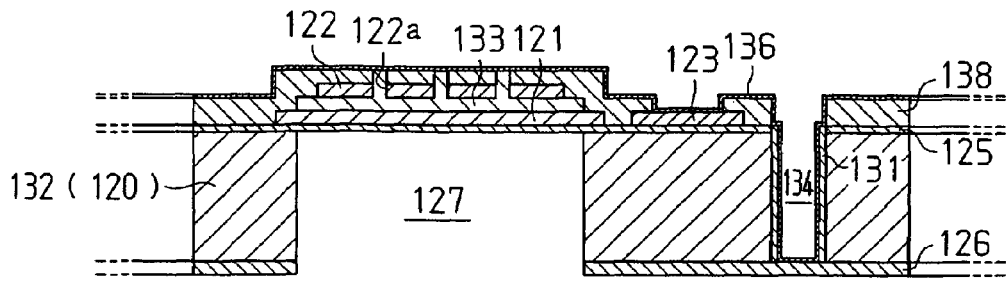

An underlayer treatment for copper plating is performed on the upper side of the silicon wafer 132. Specifically, a metal barrier layer, which includes titanium nitride (TiN), is formed on the upper side of the silicon wafer 132. A copper plating seed layer is formed on the surface of the metal barrier surface by performing sputtering. Referring to FIG. 15E, the plating underlayer film 136 is formed on the upper side of the silicon wafer 132. The plating underlayer film 136 covers the side walls of the second through holes 134 but does not cover the side walls of the first through hole 127.

Process 6: Plating Process

Figure 15F:
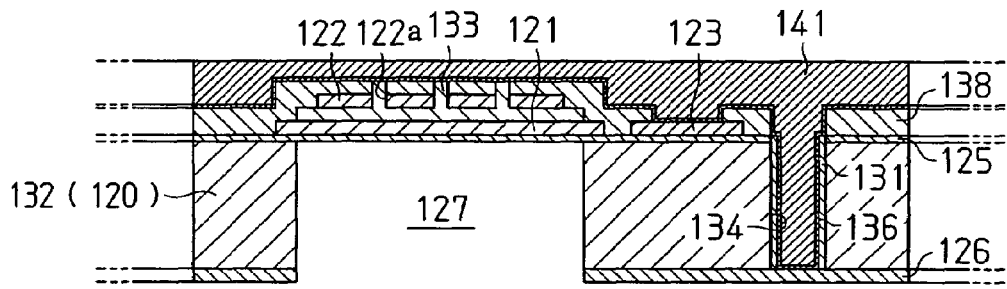

Copper plating is performed on the upper side of the silicon wafer 132. Copper plating is performed by immersing the upper side of the silicon wafer 132 in a plating bath, and supplying current to the plating underlayer film 136, which functions as a plating electrode. Referring to FIG. 15F, this forms the copper plating layer 141 in the second through hole 134 and the upper side of the silicon wafer 132.

Process 7: Etching of Plating Layer

Figure 15G:
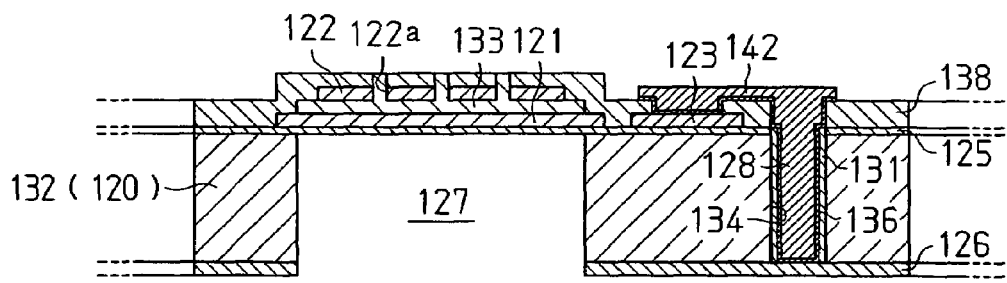

The unnecessary portion of the copper plating layer 141 is removed through etching. Thus, referring to FIG. 15G, the copper plating layer 141 remains only in the second through holes 134 and at portions corresponding to wiring 142, which connects the through electrodes 128 and the electrode pads 123, on the upper surface of the silicon wafer 132.

Process 8: Formation of Insulative Protection Film

Figure 15H:
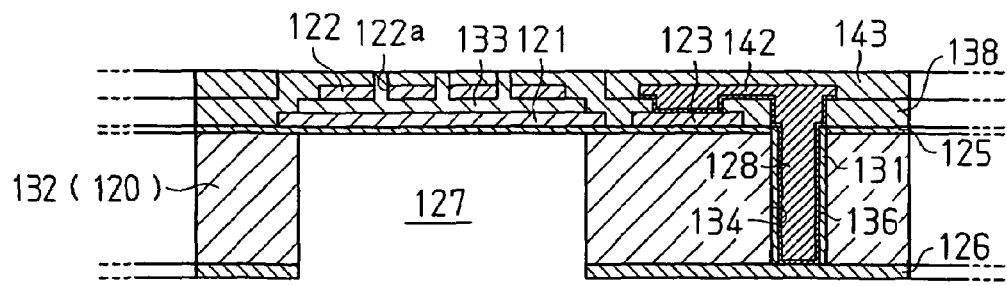

Referring to FIG. 15H, the insulative protection film 143, which includes silicon dioxide, for covering at least the through electrodes 128 and the wiring 142 is formed on the upper side of the silicon wafer 132.

Process 9: Removal of Sacrifice Layer

Figure 15I:
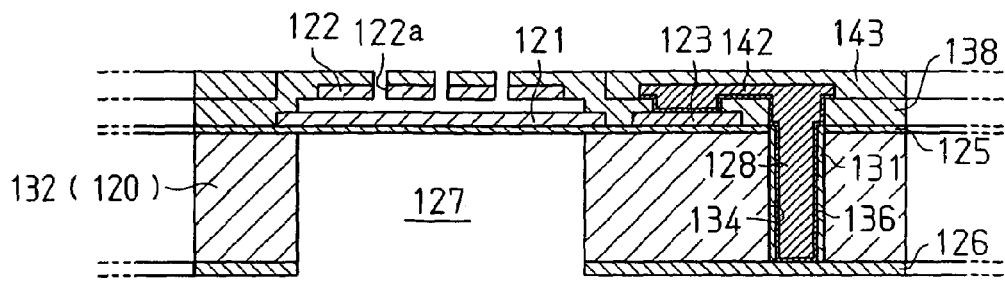

As shown in FIG. 15I, the sacrifice layer 133 formed in the air gap between the diaphragm electrode 121 and the fixed electrode 122 and in the air release holes 122a is removed through etching from the upper side of the silicon wafer 132. A space is thus formed in the interior part of the MEMS configuration.

Process 10: Etching of Insulative Protection Film

Figure 15J:
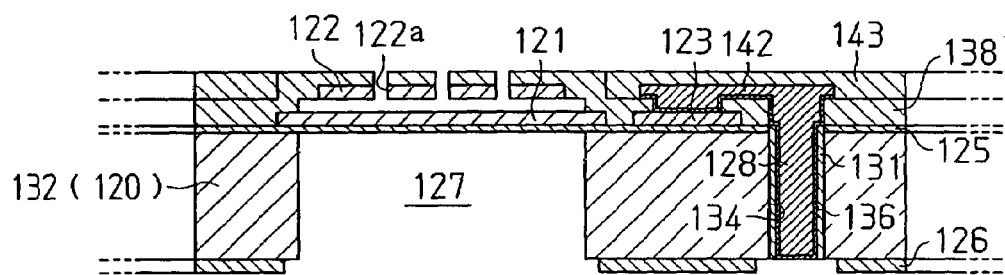

Referring to FIG. 15J, the insulative protection film 126 is removed through etching from the lower side of the silicon wafer 132 at portions corresponding to the through electrodes 128.

Process 11: Formation of Bump

Figure 15K:
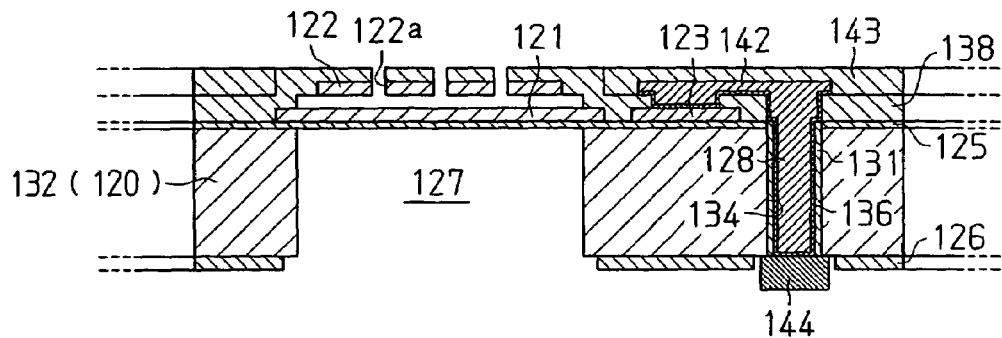

Referring to FIG. 15K, bumps 144 are formed on the lower surface of the silicon wafer 132 at portions where the insulative protection film 126 was removed. The bumps 144 electrically connect the wiring in the printed wiring board 112 and the through electrode 128 when the semiconductor sensor chip 110 is formed on the printed wiring board 112 (refer to FIG. 10).

Process 12: Dicing

Figure 15L:
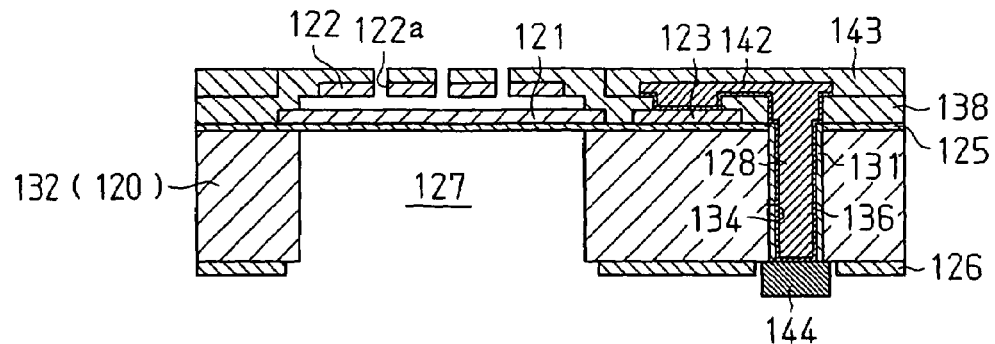

Each semiconductor sensor chip 110 is cut apart from the silicon wafer 132. Referring to FIG. 15L, this completes the manufacturing of the semiconductor sensor chip 110.

The fifth embodiment has the advantages described below in addition to advantages (1) and (2) of the fourth embodiment.

(4) In the fifth embodiment, when performing simultaneous etching to form the first through hole 127 and the second through holes 134, etching is performed from the lower side of the silicon wafer 132 for the first through hole 127 and from the upper side of the silicon wafer 132 for the second through holes 134. Therefore, the first through hole 127 and the second through holes 134 open on different surfaces of the silicon wafer 132. Thus, by filling (plating) the electric conductor (copper) from the upper side of the silicon wafer 132, in which the second through holes 134 open and the first through hole 127 is closed, when simultaneously etching and forming the first through hole 127 and the second through holes 134, the electric conductor is easily and accurately filled into only the second through holes 134 while keeping the first through hole 127 hollow.

The fourth and fifth embodiments may be modified as described below.

The details of each process in the fourth and fifth embodiments may be changed when necessary. Further, the order in which the processes are performed may be changed. Alternatively, some of the processes may be omitted.

The manufacturing methods of the fourth and fifth embodiments may be applied to manufacture the integrated chip 30 with the MEMS configuration and the sensor control integrated circuit of the second embodiment.

The present invention may also be applied to other electrostatic capacity sensing semiconductor sensors such as a pressure sensor and an acceleration sensor. Further, the present invention is not limited to electrostatic capacity sensing semiconductor sensors and may be applied to a semiconductor sensor incorporating a diaphragm.

It should be apparent to those skilled in the art that the present invention may be embodied in many other specific forms without departing from the spirit or scope of the invention. Therefore, the present invention is not to be limited to the details given herein, but may be modified within the scope and equivalence of the appended claims.

What is claimed is:

1. A semiconductor sensor comprising:
   a semiconductor substrate including a first surface and a second surface opposite the first surface;
   a diaphragm arranged in the first surface of the semiconductor substrate; and
   a through electrode extending through the semiconductor substrate from the first surface to the second surface of the semiconductor substrate.

2. A semiconductor sensor comprising:
   a semiconductor substrate including a first surface and a second surface opposite the first surface;
   a diaphragm arranged in the first surface of the semiconductor substrate; and
   a through electrode extending through the semiconductor substrate,
   wherein the semiconductor sensor is used with a printed wiring board including a wire, with the second surface of the semiconductor substrate adhered and coupled to the printed wiring board, and the through electrode being electrically connected to the wire of the printed wiring board when the semiconductor substrate is adhered and coupled to the printed wiring board.

3. A semiconductor sensor comprising:
   a semiconductor substrate including a first surface and a second surface opposite the first surface;
   a diaphragm arranged in the first surface of the semiconductor substrate;
   a through electrode extending through the semiconductor substrate; and
   a fixed electrode arranged in the first surface of the semiconductor substrate the diaphragm, the fixed electrode and the diaphragm forming a capacitor, wherein the semiconductor sensor is an electrostatic capacity sensing semiconductor sensor for outputting a detection signal in accordance with the distance between the fixed electrode and the diaphragm.

4. The semiconductor sensor according to claim 3, wherein the diaphragm vibrates in accordance with sound pressure, the vibration of the diaphragm changing electrostatic capacity of the capacitor in accordance with change in the distance, the semiconductor sensor being an acoustic sensor for outputting a detection signal in accordance with the change in electrostatic capacity of the capacitor.

5. The semiconductor sensor according to claim 1, wherein the diaphragm is one of diaphragms in a diaphragm array arranged on the semiconductor substrate.

6. The semiconductor sensor according to claim 1, further comprising:
   a control integrated circuit, formed in the first surface of the semiconductor substrate, for controlling the semiconductor sensor.

7. The semiconductor sensor according to claim 1, further comprising:
   a control integrated circuit, formed in the second surface of the semiconductor substrate, for controlling the semiconductor sensor.

8. The semiconductor sensor according to claim 1, wherein the semiconductor substrate includes a first hole for connecting the first surface and the second surface, the hole opening at a first position in the first surface, and the diaphragm being arranged at the first position in the first surface of the semiconductor substrate.

9. The semiconductor sensor according to claim 8, wherein the semiconductor substrate includes a second hole, located at a second position that differs from the first position, for connecting the first surface and the second surface, the through electrode including an electric conductor filled into the second hole.

10. A semiconductor sensor package module comprising:
    a printed wiring board;
    a cover, attached to the printed wiring board, for cooperating with the printed wiring board to define an internal space; and
    a semiconductor sensor arranged in the internal space and adhered and coupled to the printed wiring board, the semiconductor sensor including;
    a semiconductor substrate including a first surface, a second surface opposite the first surface, a first hole for connecting the first surface and the second surface at a first position, and
    a second hole for connecting the first surface and the second surface at a second position;
    a fixed electrode arranged in the first surface of the semiconductor substrate at the first position;
    a displaceable diaphragm electrode arranged in the first surface of the semiconductor substrate at the first position and facing the fixed electrode with an air gap defined between the diaphragm electrode and the fixed electrode; and
    a through electrode arranged in the second hole for connecting the first surface and the second surface of the semiconductor substrate.

11. The semiconductor sensor package module according to claim 10, wherein the fixed electrode includes a plurality of holes that are open toward the diaphragm electrode.

12. The semiconductor sensor package module according to claim 10, wherein the second surface of the semiconductor substrate is adhered and coupled to the printed wiring board, the printed wiring board includes a wire, and the through electrode is electrically connected to the wire of the printed wiring board when the semiconductor substrate is adhered and coupled to the printed wiring board.

13. The semiconductor sensor package module according to claim 10, wherein the fixed electrode and the diaphragm electrode form a capacitor, and the semiconductor sensor is an electrostatic capacity sensing semiconductor sensor for outputting a detection signal in accordance with distance between the fixed electrode and the diaphragm electrode.

14. The semiconductor sensor package module according to claim 13, wherein the diaphragm electrode vibrates in accordance with sound pressure, the vibration of the diaphragm changing electrostatic capacity of the capacitor in accordance with change in the distance, the semiconductor sensor being an acoustic sensor for outputting a detection signal in accordance with the change in electrostatic capacity of the capacitor.

15. The semiconductor sensor package module according to claim 10, wherein the diaphragm electrode is one of diaphragm electrodes in a diaphragm electrode array arranged on the semiconductor substrate.

16. The semiconductor sensor package module according to claim 10, wherein the semiconductor sensor further includes:
   a control integrated circuit, formed in the first surface of the semiconductor substrate, for controlling the semiconductor sensor.

17. The semiconductor sensor package module according to claim 1, wherein the semiconductor sensor further includes:
   a control integrated circuit, formed in the second surface of the semiconductor substrate, for controlling the semiconductor sensor.

* * * * *

UNITED STATES PATENT AND TRADEMARK OFFICE
CERTIFICATE OF CORRECTION

PATENT NO. : 7,373,835 B2 Page 1 of 1
APPLICATION NO. : 11/300445
DATED : May 20, 2008
INVENTOR(S) : Naoteru Matsubara It is certified that error appears in the above-identified patent and that said Letters Patent is hereby corrected as shown below:

On the title page of the patent, in item "(73) Assignee", please change the name of the Assignee from "Sanyo Electric Industries, Ltd." to --Sanyo Electric Co., Ltd.--.

Signed and Sealed this

First Day of September, 2009

David J. Kappos
*Director of the United States Patent and Trademark Office*